United States Patent
M'Saad et al.

(10) Patent No.: US 7,080,528 B2
(45) Date of Patent: Jul. 25, 2006

(54) METHOD OF FORMING A PHOSPHORUS DOPED OPTICAL CORE USING A PECVD PROCESS

(75) Inventors: Hichem M'Saad, Santa Clara, CA (US); Anchuan Wang, Fremont, CA (US); Sang Ahn, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 451 days.

(21) Appl. No.: 10/279,366

(22) Filed: Oct. 23, 2002

(65) Prior Publication Data

US 2004/0079118 A1 Apr. 29, 2004

(51) Int. Cl.
*C03B 37/018* (2006.01)

(52) U.S. Cl. .............................. 65/386; 65/386; 65/530

(58) Field of Classification Search ................. 65/386, 65/391, 530; 385/131
See application file for complete search history.

(56) References Cited

U.S. PATENT DOCUMENTS

| 3,806,223 | A | | 4/1974 | Keck et al. |
|---|---|---|---|---|
| 4,212,663 | A | | 7/1980 | Aslami |
| 4,351,658 | A | | 9/1982 | Olshansky |
| 4,378,987 | A | | 4/1983 | Miller et al. |
| 4,385,802 | A | | 5/1983 | Blaszyk et al. |
| 4,425,146 | A | * | 1/1984 | Izawa et al. .................. 65/420 |
| 4,528,009 | A | | 7/1985 | Sarkar |
| 4,557,561 | A | | 12/1985 | Schneider et al. |
| 4,619,680 | A | | 10/1986 | Nourshargh et al. |
| 4,856,859 | A | | 8/1989 | Imoto |
| 4,932,749 | A | | 6/1990 | Haidle et al. |
| 5,059,231 | A | | 10/1991 | Ackermann et al. |
| 5,253,319 | A | | 10/1993 | Bhagavatula |
| 5,295,220 | A | | 3/1994 | Heming et al. |
| 5,369,722 | A | | 11/1994 | Heming et al. |
| 5,408,569 | A | | 4/1995 | Nishimoto |
| 5,480,687 | A | | 1/1996 | Heming et al. |
| 5,904,491 | A | * | 5/1999 | Ojha et al. .................... 438/31 |
| 5,932,283 | A | | 8/1999 | Kaneyama |
| 6,077,764 | A | | 6/2000 | Sugiarto et al. |
| 6,080,683 | A | | 6/2000 | Faur et al. |
| 6,109,065 | A | | 8/2000 | Atkins et al. |

(Continued)

FOREIGN PATENT DOCUMENTS

EP 0 659 902 A1 6/1995

(Continued)

OTHER PUBLICATIONS

Dominguez et al., "The effect of rapid thermal annealing on properties of plasma enhanced CVD silicon dioxide films", Thin Film Solids 346, Jun. 1999. pp. 202-206.*

(Continued)

*Primary Examiner*—Sean Vincent
(74) *Attorney, Agent, or Firm*—Townsend and Townsend and Crew LLP

(57) ABSTRACT

Embodiments of the present invention provide a highly uniform low cost production worthy solution for manufacturing low propagation loss optical waveguides on a substrate. In one embodiment, the present invention provides a method of forming a PSG optical waveguide on an undercladding layer of a substrate that includes forming at least one silicate glass optical core on said undercladding layer using a plasma enhanced chemical vapor deposition process including a silicon source gas, an oxygen source gas, and a phosphorus source gas, wherein the oxygen source gas and silicon source gas have a ratio of oxygen atoms to silicon atoms greater than 20:1.

22 Claims, 17 Drawing Sheets

U.S. PATENT DOCUMENTS

| | | | |
|---|---|---|---|
| 6,122,934 | A | 9/2000 | Narita et al. |
| 6,154,582 | A | 11/2000 | Bazylenko et al. |
| 6,156,483 | A | 12/2000 | McCoy et al. |
| 6,192,712 | B1 | 2/2001 | Saito et al. |
| 6,194,038 | B1 | 2/2001 | Rossman |
| 6,204,200 | B1 | 3/2001 | Shieh et al. |
| 6,207,353 | B1 | 3/2001 | Armacost et al. |
| 6,261,857 | B1 | 7/2001 | Alam et al. |
| 6,326,325 | B1 | 12/2001 | Dawson-Elli et al. |
| 6,408,125 | B1 | 6/2002 | Akwani et al. |
| 6,451,686 | B1 | 9/2002 | Ngai et al. |
| 6,614,977 | B1 | 9/2003 | Johnson et al. |
| 6,705,124 | B1 | 3/2004 | Zhong et al. |
| 2002/0192393 | A1* | 12/2002 | Ouellet et al. ............ 427/569 |
| 2003/0068902 | A1* | 4/2003 | Wang et al. ............ 438/788 |
| 2003/0070451 | A1* | 4/2003 | Ouellet et al. ............ 65/386 |
| 2003/0110808 | A1 | 6/2003 | M'Saad et al. |
| 2003/0113085 | A1 | 6/2003 | M'Saad et al. |

FOREIGN PATENT DOCUMENTS

| | | |
|---|---|---|
| EP | 0 803 589 B1 | 5/2000 |
| EP | 0 735 160 B1 | 8/2000 |
| GB | 2 312 439 A | 4/1996 |
| WO | WO 00/68718 A1 | 11/2000 |
| WO | WO 00/79033 A1 | 12/2000 |

OTHER PUBLICATIONS

Haque et al., "Post-deposition processing of low temperature PECVD silicon dioxide films for enhanced stress stability", Thin Film Solids 308-309, Oct. 1997, pp. 68-73.*

Choi et al., "Effects of process parameters on the growth of thick SiO2 using plasma enhanced chemical vapor deposition with hexamethydisilazane", Surface and Coatings Technology 131, Sep. 2000, pp. 136-140.*

Bapin et al., "Deposition of SiO2 films from different organosilicon/O2 plasmas under continuous wave and pulsed modes", Surface and Coatings Technology, Jul. 2001, pp. 649-654.*

Wilson et al., Handbook of Multilevel Metallization for Integrated Circuits—Materials, Technology, and Applications, William Andrew Publishing/Noyes, Copyright 1993. pp. 202-232.*

Hoffmann, Martin; Kopka, Peter; and Voges, Edgar, *Low-Loss Fiber-Matched Low-Temperature PECVD Waveguides with Small-Core Dimensions for Optical Communication Systems*, IEEE Photonics Technology Letters, vol. 9, No. 9, Sep. 1997, pp. 1238-1240.

Matthews, Manyalibo J. et al. "Characterization of phosphosilicate thin films using confocal Raman microscopy" Review of Scientific Instruments, May 2000, pp. 2117-2120, vol. 71, No. 5, American Institute of Physics.

Verbeek, B.H. et al. "Integrated Four-Channel Mach-Zehnder Multi/Demultiplexer Fabricated with Phosphorous Doped SiO2 Waveguides on Si" Journal of Lightwave Technology, Jun. 1988, pp. 1011-1015, vol. 6, No. 6, IEEE.

Valette, S. et al. "Si-Based Integrated Optics Technologies" Solid State Technology, Feb. 1989, pp. 69-75.

Valette, S. et al. "State of the art of integrated optics technology at LETI for achieving passive optical components" Journal of Modern Optics, 1988, pp. 993-1005, vol. 35, No. 6.

\* cited by examiner

| | 1,HEAT UP | 2,STAB | 3,DEP | 4,TERMINATION STEP | 5,PUMP |
|---|---|---|---|---|---|
| Step number, name | | | | | |
| Step Selection | ABC--- SoFar=ANY | ABC--- SoFar=ANY | ABC--- SoFar=ANY | ABC--- SoFar=ANY | ABC--- SoFar=ANY |
| Step end control | By Time | By Time | By Time | By Time | By Time |
| Maximum step time | 50.0 seconds | 8.0 seconds | 135.0 seconds | 10.0 seconds | 10.0 seconds |
| Endpoint selection | No Endpoint | No Endpoint | No Endpoint | No Endpoint | No Endpoint |
| Pressure | Servo 2.8 Torr | Servo 2.8 Torr | Servo 2.8 Torr | Servo 2.8 Torr | Throttle fully open |
| Pressure ramp rate | 0 Torr | 0 Torr | 0 Torr | 0 Torr | 0 Torr |
| RF power/RF2 power | 0, 0 W, | 0, 0 W, | 400, 0 W, | 400, 0 W, | 0, 0 W, |
| Heater Temperature | 550o (Wafer ~4530) | 550o (Wafer ~4530) | 550o (Wafer ~4690) | 550o (Wafer ~4690) | 550o (Wafer ~4960) |
| Temperature ramp | 0.00 o/sec | 0.00 o/sec | 0.00 o/sec | 0.00 o/sec | 0.00 o/sec |
| Heater spacing | 565 mils | 565 mils | 565 mils | 565 mils | 565 mils |
| Temp. preset | 200 mWatts | 200 mWatts | 200 mWatts | 200 mWatts | 200 mWatts |
| Liq Inj Bypass | To Chamber | To Chamber | To Chamber | To Chamber | To Chamber |
| Gas names and flows | SIH4 : 0 scc | SIH4 : 100 scc | SIH4 : 100 scc | SIH4 : -1FPmp | SIH4 : -1FPmp |
| | N2O : 3600 scc | N2O : 3600 scc | N2O : 3600 scc | N2O : 3600 scc N2O | N2O : -1FPmp |
| | PH3:N2 : 0 scc | PH3:N2 : 220 scc | PH3:N2 : 220 scc | PH3:N2 : -1FPmp | |
| | : 0 scc | : 0 sc | : 0 sc | : 0 scc | |
| | : 0 scc | : 0 scc | : 0 scc | : 0 scc | |

Fig. 18

METHOD OF FORMING A PHOSPHORUS DOPED OPTICAL CORE USING A PECVD PROCESS

BACKGROUND

The present invention relates to the manufacture of integrated systems, and more particularly to a method of forming optical cores. Optical cores manufactured according to the present invention are useful in a variety of applications, and are particularly useful in integrated optical systems.

Integrated optical systems are an emerging technology that offer solutions to some previously unsolvable technological problems. Thus, integrated optical systems are becoming an increasingly important technology. Generally, optical systems utilize pulses of light rather than electric current to carry out such functions as data transmission, data routing, or other forms of data communication or data processing. One important structure commonly utilized in optical systems is an optical waveguide.

Optical waveguides are used to confine and direct light between the various components of an optical system. For example, optical waveguides may be used to carry Dense Wavelength Division Multiplexed (DWDM) light, which is used to increase the number of wavelengths in a single waveguide to achieve a higher aggregate bandwidth. FIG. 1 is a cross-sectional view of an optical fiber waveguide. The general structure of an optical waveguide 100 comprises two principal components: a core 103 and a cladding layer 102. The core 103 is the inner part of the fiber through which light is guided. It is surrounded by the cladding layer 102, which generally has a lower refractive index so that a light ray 105 in the core 103 that strikes the core/cladding boundary at a glancing angle is confined within the core 103 by total internal reflection. The confinement angle $\theta_c$ represents an upper limit for the angle at which the light ray 105 can strike the boundary and be confined within the core 103.

As more signals are incorporated into an optical waveguide channel, there is an increasing demand for components to route, switch, drop, and guide these light signals to their final destination. Many photonic components make this technology possible. These components include filters, modulators, amplifiers, couplers, multiplexers, optical cross-connects, Arrayed Waveguide Gratings (AWG), power splitters, and star couplers to name only a few. However, as optical technology matures, it is desirable to monolithically integrate various photonic components onto a single structure such as, for example, a silicon or glass substrate. Generally, processes for manufacturing an optical core on a substrate must result in structures that have good optical qualities. Additionally, such manufacturing processes must result in optical cores that are highly uniform across the substrate.

Attempts to integrate optical waveguides and photonic components onto a single chip have faced many challenges. For example, one optical waveguide core characteristic that is important to the performance of an optical system is propagation loss, which is also referred to as attenuation. Attenuation refers to the loss of light energy as a pulse of light propagates down a waveguide channel. The two primary mechanisms of propagation loss are absorption and scattering. Absorption is caused by the interaction of the propagating light with impurities in the waveguide channel. For example, electrons in the impurities may absorb the light energy and undergo transitions. The electrons may then give up the absorbed energy by emitting light at other wavelengths or in the form of vibrational energy (i.e., heat or phonons). Thus, the manufacturing processes used for building the optical waveguide cores must minimize the introduction of impurities that lead to propagation loss from absorption.

The second primary mechanism, scattering, results from geometric imperfections in the fiber that cause light to be redirected out of the fiber, thus leading to an additional loss of light energy. Accordingly, optical waveguide core uniformity is of paramount importance. Therefore, for satisfactory optical waveguides, the manufacturing process has the additional critical requirement of providing integrated optical waveguide core structures that are highly uniform across the substrate structure upon which they are built. Furthermore, the manufacturing process must maintain such uniformity across multiple process runs.

Another important parameter relating to optical cores is stress, which in one form is related to the difference in the coefficient of thermal expansion between the optical core and surrounding structures. Stress can produce a density change in the optical core structure. Typically, stress in an optical core is anisotropic. Anisotropic stress causes the permittivity and refractive index of core to be functions of direction, which causes the light to deleteriously propagate faster in one direction than in other directions. For example, the refractive index along the direction of the stress can be different from the refractive index perpendicular to it, causing light polarized along the direction of the stress to propagate at a different rate than light polarized perpendicular to the direction of the stress. This phenomena is sometimes referred to as birefringence, and can lead to distortion of the optical signals in a fiber. Problems associated with stress become compounded as optical cores are manufactured on larger wafer sizes. In particular, stress on larger wafers (e.g., 200 mm and up) can lead to bowing, which interferes with subsequent lithography during patterning of the core.

Another parameter critical to manufacturing integrated optical cores is refractive index uniformity. Uniformity in optical waveguide applications requires an extremely tight film homogeneity across the substrate and between wafer to wafer. Prior art integrated circuit manufacturing processes have previously been used primarily for processing electrical devices on a semiconductor substrate, where the principal concern is the electrical properties of materials, usually characterized by the dielectric constant and breakdown voltage. However, for optical applications refractive index tolerances can be constrained, for example, to within the range of ±0.0002, which is substantially more stringent (e.g., about 2 orders of magnitude more stringent) than for semiconductor electronic fabrication processes.

At present, known integrated optical core manufacturing techniques have a variety of shortcomings. For instance, one prior art technique uses flame hydrolysis for depositing the optical core. However, flame hydrolysis processes are costly and lead to poor uniformity on large substrates. Another prior art technique uses a low pressure chemical vapor deposition process ("LPCVD"). However, known LPCVD techniques suffer from low deposition rates that result in increased production costs. Furthermore, prior art plasma enhanced chemical vapor deposition ("PECVD") processes suffer from high propagation losses, high stresses, or poor uniformity.

Thus, there is a need for an improved method of manufacturing an integrated optical core to allow for the efficient integration of optical systems on a single structure.

SUMMARY

Embodiments of the present invention provide a highly uniform low cost production worthy solution for manufacturing low propagation loss optical waveguides on a substrate. In one embodiment, the present invention provides a method of forming an optical waveguide on an undercladding layer of a substrate that includes forming at least one silicate glass optical core on said undercladding layer using a plasma enhanced chemical vapor deposition process including a silicon source gas, an oxygen source gas, and a phosphorus source gas, wherein the oxygen source gas and silicon source gas have a ratio of oxygen atoms to silicon atoms greater than 20:1.

In another embodiment, a termination step is provided after the deposition step wherein all source gases, except the oxygen source gas, are evacuated from the deposition chamber after the optical core is formed.

In one embodiment, optical cores having a refractive index of less than 1.5 are formed. The contrast between the refractive index of the core and the refractive index of the cladding layer is less than 2%. In one embodiment, constrasts in the range of about 0.6%–1.0% may be formed.

In another embodiment, an anneal step is added to further improve the optical properties of the core.

A further understanding of the nature and advantages of the present invention may be realized by reference to the remaining portions of the specification and the drawings.

BRIEF DESCRIPTION OF THE DRAWINGS

FIG. 18 illustrates a PECVD process recipe for depositing a PSG optical core according to another embodiment of the present invention.

DETAILED DESCRIPTION

Figure 1:
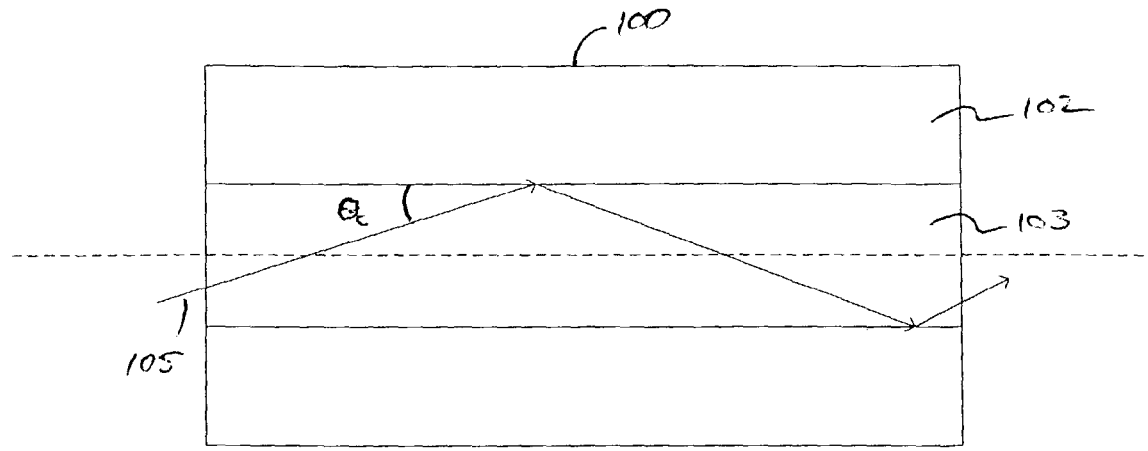
FIG. 1 is a cross-sectional view of an optical fiber waveguide.

1. Formation of a PSG Optical Waveguide Core

Embodiments of the present invention provide plasma enhanced chemical vapor deposition ("PECVD") process techniques for depositing phosphorous-doped silicate-glass ("PSG") optical cores having properties suitable for optical applications.

As mentioned above, PECVD processes have previously been used primarily for processing electrical devices on a semiconductor substrate, where the principal concern is the electrical properties of materials. Furthermore, known PECVD processes used for optical applications suffer from undesirably high loss, high stress, or poor refractive index uniformity. In contrast, PECVD processes carried out according to embodiments of the present invention achieve improved optical characteristics such as uniformity, stress, and propagation loss.

Embodiments of the present invention include using a PECVD process including a silicon source gas, an oxygen source gas, and a phosphorous source gas to form a PSG optical core on a substrate. Exemplary silicon source gases may include $Si_xH_{2x+2}$ (e.g., $SiH_4$, $Si_2H_6$, or $Si_3H_8$), $Si_xH_{2x}$ (e.g., $Si_2H_4$), $SiH_2Cl_2$, tetraethylorthosilicate ("TEOS"), methylsilane (i.e.,$(CH_3)SiH_3$), dimethylsilane (i.e., $(CH_3)_2SiH_2$) or trimethylsilane (i.e.,$(CH_3)_3SiH$). Additionally, exemplary oxygen source gases may include $N_2O$, $CO_2$, or $CO$.

Embodiments of the present invention utilize a phosphorous source gas as a dopant the PECVD deposition process to alter the optical properties of the core. First, phosphorous may be used to decrease stress in the optical core. Second, phosphorous will also cause slight increases in the refractive index of the optical core, which may be used at least in part to set the contrast between the core and the cladding (i.e., the difference in refractive index between the core and the cladding). The refractive index of an $SiO_2$ based core will be increased by a phosphorus dopant because phosphorus results in a greater polarization of the light in the core than oxygen. An exemplary phosphorus containing source gas is $PH_3$. In one embodiment, the phosphorous source gas comprises 5% $PH_3$ diluted in 95% $N_2$. Other embodiments may use argon, helium, or other inert gases to dilute the phosphorous source gas. In another embodiment, undiluted $PH_3$ may be used (i.e., 100% $PH_3$), in order to provide better chamber to chamber and system to system repeatability.

Embodiments of the present invention improve uniformity of a PSG optical core by carrying out the PECVD process in an oxygen rich environment. As previously mentioned, a particular concern with the fabrication of optical waveguides is that the processes utilized must result in highly uniform structures. The inventors have discovered that carrying out the PECVD process in an oxygen rich environment can result in PSG optical cores with refractive index uniformity levels that are satisfactory for optical applications. More particularly, improvements in refractive index uniformity have been found where the ratio of oxygen atoms to the silicon atoms in the source gases is greater than 20:1. Phosphorous may then be added to reduce stress and achieve changes in the refractive index.

Too little oxygen in the chamber will starve the formation of $SiO_2$. Therefore, insufficient oxygen content may lead to variations in the refractive index because there is poor $SiO_2$ uniformity across the layer (e.g., there may be silicon to silicon bonds in the $SiO_2$ layer). When the ratio of oxygen to silicon atoms is greater than 20:1, there is sufficient oxygen to bond with all of the silicon atoms for form $SiO_2$, and additionally, fluctuations in the flow of the oxygen source gas will not impact $SiO_2$ formation.

For example, in one embodiment of the present invention a ratio of 36:1 is used (e.g., $N_2O:SiH_4=36:1$). It is to be understood that the ratio of source gases may change according the particular silicon and oxygen content. It should be noted that increasing the oxygen content utilized during the PECVD process will also impact the refractive index of the film. Accordingly, when the PECVD process is carried out in an oxygen rich environment, more phosphorous should be incorporated into the optical core to maintain the desired refractive index.

The optical properties of the core may be further improved by carrying out the PECVD process at increased processing temperatures. For example, in one embodiment, processing temperatures of 550° C. or higher can be used during the PECVD process. Increased processing temperatures during the optical core deposition step are advantageous because high temperatures lead to a higher desorption and thus further reduce hydrogen content, which leads to reductions in propagation loss.

Energy is generally a function of the pressure used in the processing chamber, and the power supplied to the processing chamber. Some embodiments of the present invention form an optical core at a pressure of less than 10 Torr and an RF power of between about 1–2 Watts/cm$^2$ (e.g., about 300–600 Watts for a 200 mm wafer). In one embodiment, an optical core is formed at a pressure of about 2.8 Torr, and RF power of about 1.5 Watts/cm$^2$ (e.g., about 400 Watts for a 200 mm wafer).

Optical cores according to embodiments of the present invention may be formed by either a one-step or a multi-step deposition. A one-step deposition is when the total thickness of the core is deposited without interruption. On the other hand, a multi-step deposition is when the core is deposited layer by layer. For example, in a two-step deposition about half (or some other portion) of the thickness is originally deposited, and then the wafer is take out of the chamber during an in-situ dry clean of the chamber. The wafer is then returned to the chamber, and the deposition is completed. Additional steps may be used by sequentially depositing thinner portions of the core during each deposition step.

One problem that has been observed is that after the deposition is completed, optical imperfections are formed on the newly deposited material. Optical imperfections are also sometimes referred to as hazing. These optical imperfections appear in both doped and undoped oxides. Thus, one-step deposition is preferred for optical cores because a multi-step deposition results in an interface within the oxide that may include these optical imperfections. However, in some instances it may be desireable to utilize a two-step deposition for thicker cores. Embodiments of the present invention include a termination step that reduces these optical imperfections. Substantial improvements in hazing can be achieved by adding a termination step after the deposition step, wherein all source gases except the oxygen containing gas are evacuated from the deposition chamber. For example, one embodiment of the present invention includes a $N_2O$ plasma purge step lasting between about 5–10 seconds, during which all other source gases are evacuated.

Embodiments of the present invention may also use a post deposition anneal step to further improve the optical properties of the core. The anneal step may be carried out in a steam ambient for lowest possible stress. However, other ambients, such as molecular oxygen ($O_2$) or nitrogen ($N_2$) for example, may also be used. A post furnace anneal step can improve both the refractive index range, propagation loss, and stress. The inventors have also found that the effect of a post furnace anneal step on the refractive index of the core is independent of the temperature used during the deposition process. In some embodiments, the anneal step utilizes a temperature between 1000–1100° C. for between about 2–4 hours. In one exemplary embodiment, improvements in refractive index uniformity, propagation loss, and stress are found to occur after a furnace anneal of about 2 hours. One exemplary temperature that may be used for the anneal step is about 1050° C.

Embodiments of the present invention are particularly advantageous for forming low contrast optical cores. The contrast, Δn, of an optical core is given by the following equation:

$$\Delta n = \frac{n_{core} - n_{cladding}}{n_{core}}$$

Low contrast optical cores typically have a Δn<2%, and typically include optical cores with lower refractive indices (i.e., n<1.5). Low contrast cores are advantageous for a variety of applications including low insertion loss applications such as splitters, interleavers, or concentrators, which may utilize a contrast of about Δn=0.6%, for example. Low contrast cores may also be advantageous for arrayed waveguide gratings, which may utilize a contrast of about Δn=0.8%.

Figure 2:
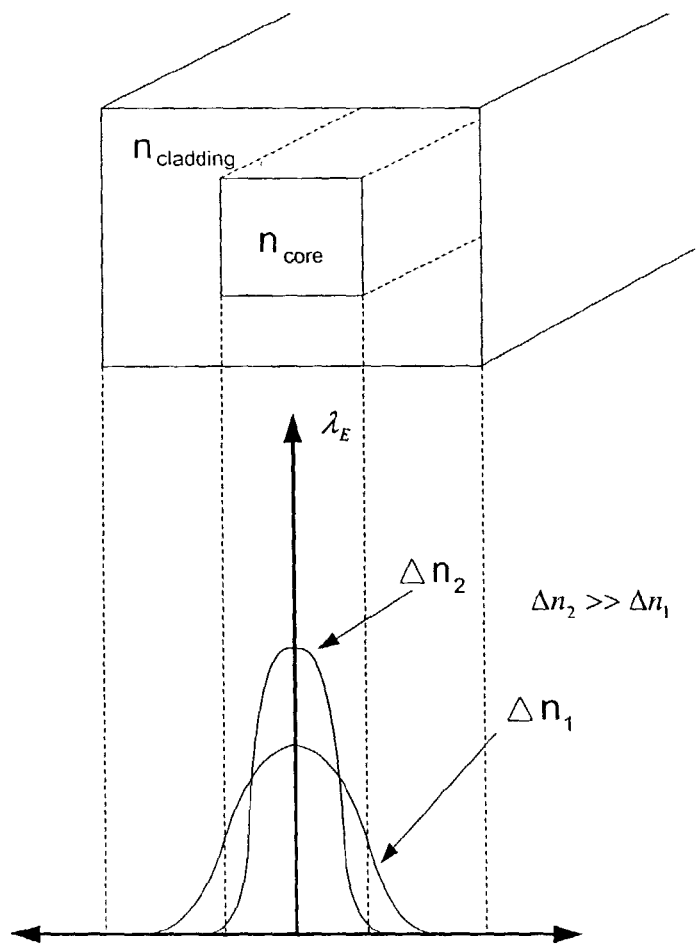
FIG. 2 shows a cross-section of a fiber and a graph illustrating the energy distribution of the light energy $\lambda_E$ in the core.

For low contrast applications, lower refractive indices are typically used, and the light is optically spread out across a greater portion of the core. FIG. 2 illustrates this concept. FIG. 2 shows a cross-section of a fiber and a graph illustrating the energy distribution of the light energy $\lambda_E$ in the core. As shown in FIG. 2, as the contrast Δn increases, more of the light energy is confined within the core, and less light energy is in the cladding layer. Therefore, as Δn increases thinner cores may be used to carry the optical signals, and as Δn decreases thicker cores are typically used to carry the optical signals.

Embodiments of the present invention are particularly useful for forming PSG optical cores having a low refractive index. Exemplary embodiments of the present invention may be used to form a PSG optical core having a refractive index in the range of 1.45 to 1.46 measured at 1550 nm, which corresponds to a refractive index range of about 1.46 to 1.475 measured at 633 nm. When a PSG optical core is deposited on an underlayer (e.g., an undercladding layer) that has a refractive index of about 1.46 measured at 633 nm on thick thermal oxides, an index contrast of about 0.6% to about 1.0% between the core and the cladding can be achieved. Among other factors, the above referenced range of refractive indices for the core can be achieved by incorporating between about 6.5 to 11.0 wt. % phosphorous into the optical core (e.g., See FIG. 9 below). Optical cores in this refractive index range can be formed with a thickness of between about 4.5 to 7.2 μm or more. However, those skilled in the art will understand that the thickness of the optical core will depend on the application and the particular targeted refractive index. Typically, a larger refractive index corresponds to a thinner optical core because of the higher light confinement illustrated in FIG. 2.

Figure 3:
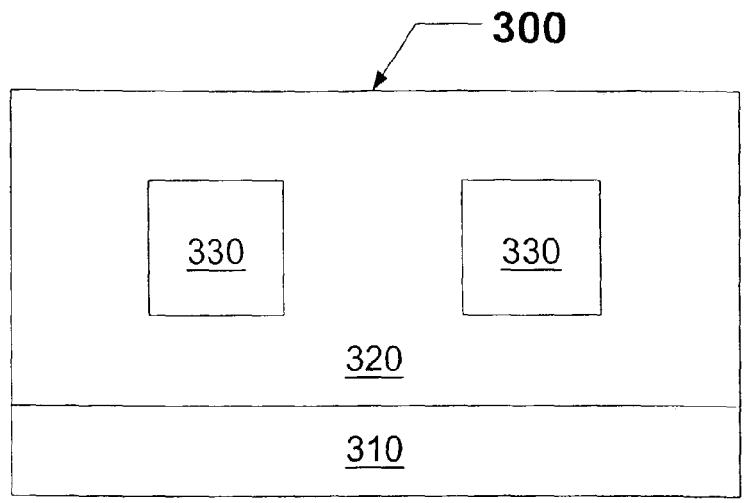
FIG. 3 is a cross-sectional view of an optical waveguide having a core, an undercladding layer, and an uppercladding layer according to one embodiment of the present invention.

FIG. 3 is a cross-sectional view of a optical waveguide 300 including a PSG optical core according to one embodiment of the present invention. The optical waveguide 300 may be manufactured on a substrate 310, which may be a silicon substrate, for example. However, it is to be understood that a variety of substrates could be used, such as a glass (i.e., silica) substrate, a lithium-niobate $LiNbO_3$ substrate, a silicon-germanium SiGe substrate, a III–V compound substrate (e.g., indium-phosphide InP or gallium-arsenide GaAs), or other suitable material. The optical waveguide 300 includes an optical waveguide core 330, which is completely surrounded by an optical cladding layer 320. The core 330 is the inner part of the fiber through which light is guided. The cladding layer 320 generally has a lower refractive index so that a light ray in the core that strikes the core/cladding boundary at a glancing angle is confined within the core by total internal reflection.

Figure 4:
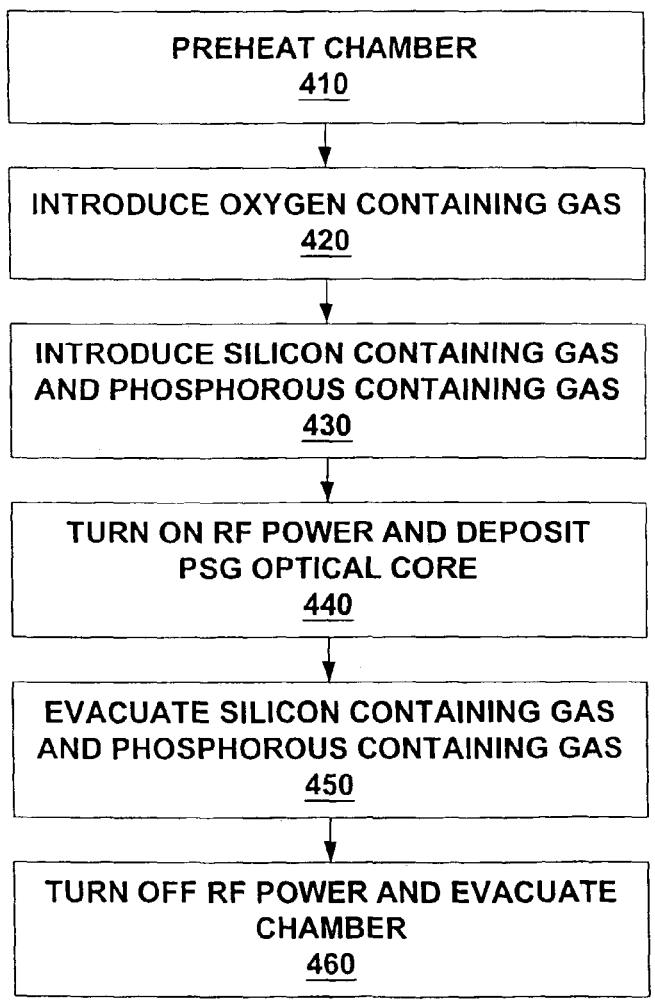
FIG. 4 illustrates a method of forming a PSG optical core using a PECVD process according to one embodiment of the present invention.

FIG. 4 illustrates a method of forming a PSG optical core using a PECVD process according to one embodiment of the present invention. At step 410, the PECVD deposition chamber is preheated. The deposition chamber may be heated to greater than 300° C., for example. At step 420, an oxygen containing gas such as $N_2O$ is introduced into the chamber. At step 430, a silicon containing gas, such as $SiH_4$, and a phosphorous containing gas, such as 5% $PH_3$ diluted in 95% $N_2$, are introduced into the deposition chamber. At step 440, RF power is turned on, a plasma is created in the deposition chamber, and a PSG optical core is deposited on a substrate located in the chamber. After an amount of time corresponding to the desired thickness of the optical core, the silicon containing gas and phosphorous containing gas are evacuated from the chamber at step 450 (i.e., the silicon and phosphorous sources are turned off). However, according to some embodiments of the present invention the oxygen containing gas, which in this particular case may be $N_2O$, is maintained in the chamber to reduce optical imperfections (i.e., hazing) in the PSG optical core. At step 460, the RF power is turned off, and the oxygen containing gas is evacuated from the chamber.

A suitable process recipe for depositing a PSG optical core on a 200 mm substrate using a PECVD process according to one embodiment of the present invention is summarized in Table 1 below:

TABLE 1

| Process Parameter | Range | Exemplary Value |
|---|---|---|
| Φ($SiH_4$) (sccm) | 10–1000 | 100 |
| Φ($N_2O$) (sccm) | 200–25k | 3600 |
| Φ($PH_3$) (sccm) | up to 100 | 110 |
| Φ($N_2$) (sccm) | up to 1900 | 209 |
| Source RF Density-(Watts/cm$^2$) | 1–2 | 1.5 |
| Pressure (Torr) | less than 10 | 2.8 |
| Temp (° C.) | greater than 300 | 550 |

For the recipe shown in Table 1, the phosphorous containing gas is diluted in $N_2$, However, as mentioned above, other embodiments may use argon. As a noble gas, argon stabilizes the plasma because noble gases ionize more easily, thereby helping the dissociation of other species in the plasma. It is to be understood, however, that other carrier gases such as helium, neon, xenon, or krypton could also be used.

Figure 5A:
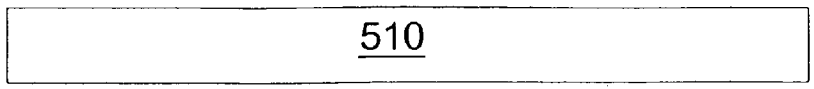
FIGS. 5A–5E illustrate a first method of forming an optical waveguide core according to one embodiment of the present invention.
Figure 5B:
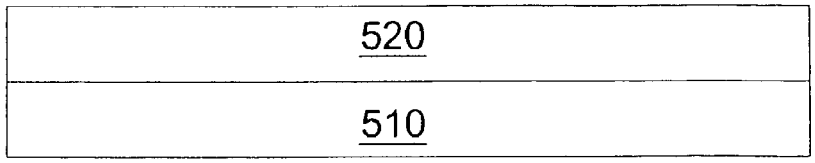

FIGS. 5A–5E illustrate a method of forming an optical waveguide according to one embodiment of the present invention. The technique used in FIGS. 5A–5E includes forming a continuous core layer across the entire substrate, then defining the optical cores by patterning, and then etching away unwanted portions of the core layer. This approach is sometimes referred to as a blanket-etch approach. As shown in FIG. 5A, a silica substrate 510 may be used as the base for the optical waveguide. An undercladding layer 520 is then formed over substrate 510 (FIG. 5B). In one particular embodiment, undercladding layer 520 is formed of undoped $SiO_2$ ("USG"), but more generally, the undercladding layer 520 may be formed from any material having a lower refractive index than the core material. The undercladding layer 520 is typically a thermal oxide or a high-pressure oxide.

Figure 5C:
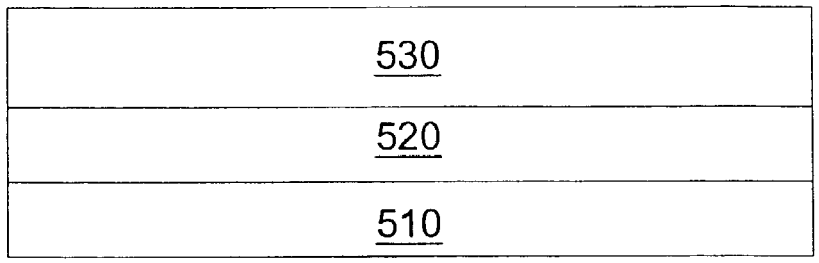

Next, a continuous optical core layer 530 is formed over undercladding layer 520 (FIG. 5C). Optical core layer 530 is formed using a PECVD process as discussed herein. In the embodiment shown in FIGS. 5A–5E, a continuous optical core layer 530 is formed across the entire wafer surface. Because the deposition surface is substantially flat and includes no trenches, no gap filling is required. Accordingly, the high-density plamsa process may be used with no RF bias. This has the effect of further reducing the hydrogen content in the optical core layer 530 because RF bias has been found to cause increases in hydrogen content in the deposited core.

Figure 5D:
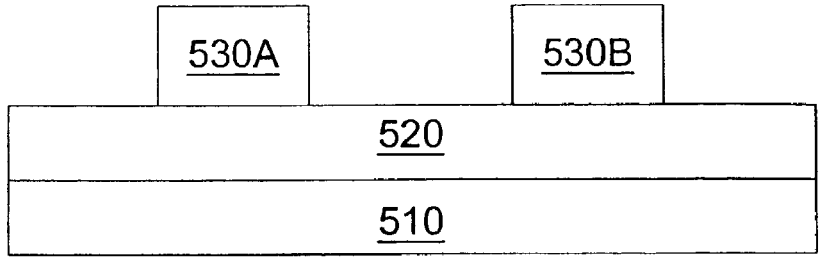

After deposition of the continuous optical core layer 530, the layer is etched to form at least one optical core (FIG. 5D). Techniques for etching doped silicate glass layers, such as PSG and others, are well-known to those skilled in the art and are not described here. Two optical cores 530A and 530B are illustrated in FIG. 5D. An anneal step may also be included before etch to further improve the propagation loss. An anneal step may utilize a temperature between 1000–1100° C. for between 2–4 hours.

Figure 5E:
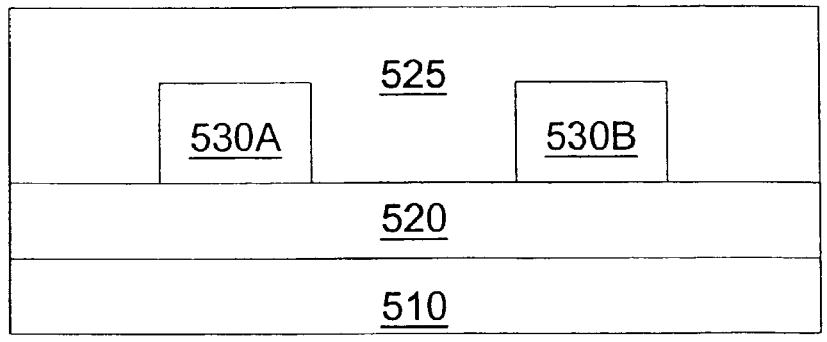

An uppercladding layer 525 is then formed over the optical cores 530A and 530B (FIG. 5E). In some embodiments of the invention, uppercladding layer 525 is a BPSG layer. It will be appreciated that if more than one optical core is formed, for example optical cores 530A and 530B, then gaps between the optical cores 530A and 530B are typically filled as fully as possible with appropriate gap filling techniques during the deposition of layer 525.

Figure 6A:
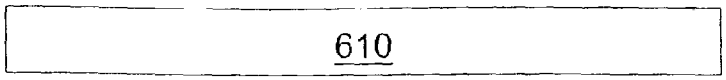
FIGS. 6A–E illustrate a second method of forming an optical waveguide core according to another embodiment of the present invention.
Figure 6B:
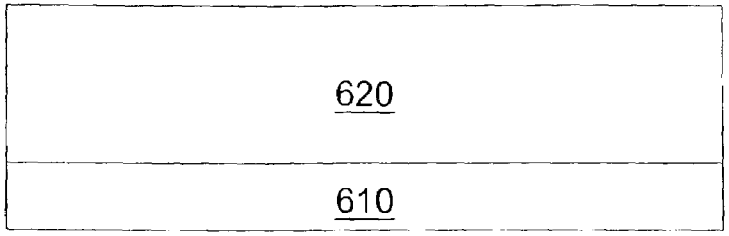
Figure 6C:
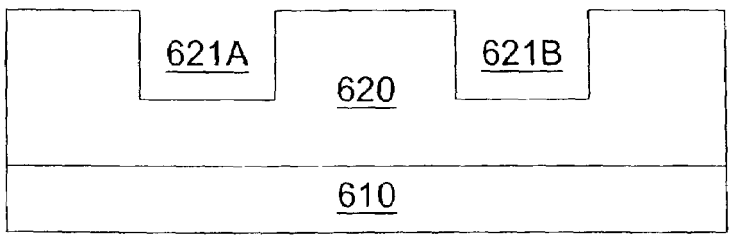
Figure 6D:
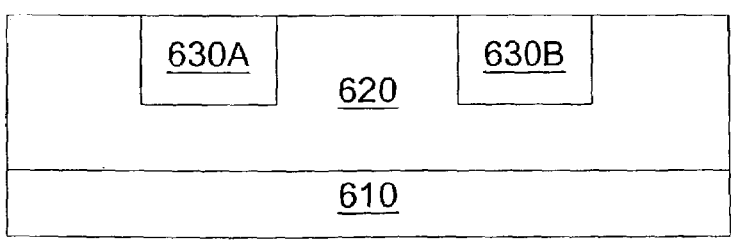

FIGS. 6A–E illustrate another method of forming an optical waveguide according to another embodiment of the present invention. The technique used in FIGS. 6A–6E includes laying down the undercladding layer across the entire substrate and then forming trenches in the undercladding layer for receiving and defining optical cores. This approach is sometimes referred to as a gap-fill or "Damascene" approach. As shown in FIG. 6A, a substrate 610 may be used as the base for the optical waveguide. An undercladding layer 620 is formed over substrate 610 (FIG. 6B). The undercladding layer 620 may typically be a thermal oxide or a high-pressure oxide. For the present embodiment, the undercladding layer 620 is deposited to a thickness sufficient to include the thickness of the optical core material. Next, the undercladding layer 620 is etched to form at least one trench 621A and/or 621B (FIG. 6C). Optical cores 630A and 630B are then deposited using a PECVD process, as discussed herein, in the trenches 621A–B in the undercladding layer 620 (FIG. 6D).

Figure 6E:
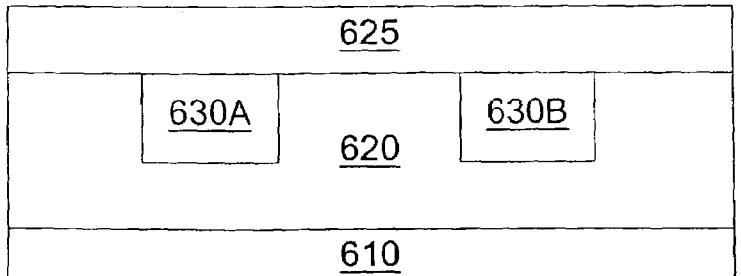

In the embodiment shown in FIGS. 6A–6E, the optical cores are deposited in trenches, and therefore, trench filling techniques are required. Accordingly, an RF bias may be used in this case with the PECVD process to improve trench filling during the optical core deposition. For example, in one embodiment, an RF bias power density of between 0 to 16 watts per square centimeter is used to improve trench filling of the deposition. Additionally, a chemical mechanical polish ("CMP") or etch will typically be used to planarize the surface and expose optical cores 630A and 630B, and undercladding layer 620, before deposition of the uppercladding layer 625. After a CMP, uppercladding layer 625 may then be formed over the exposed optical cores 630A and 630B, and exposed undercladding layer 620 (FIG. 6E).

Figure 7:
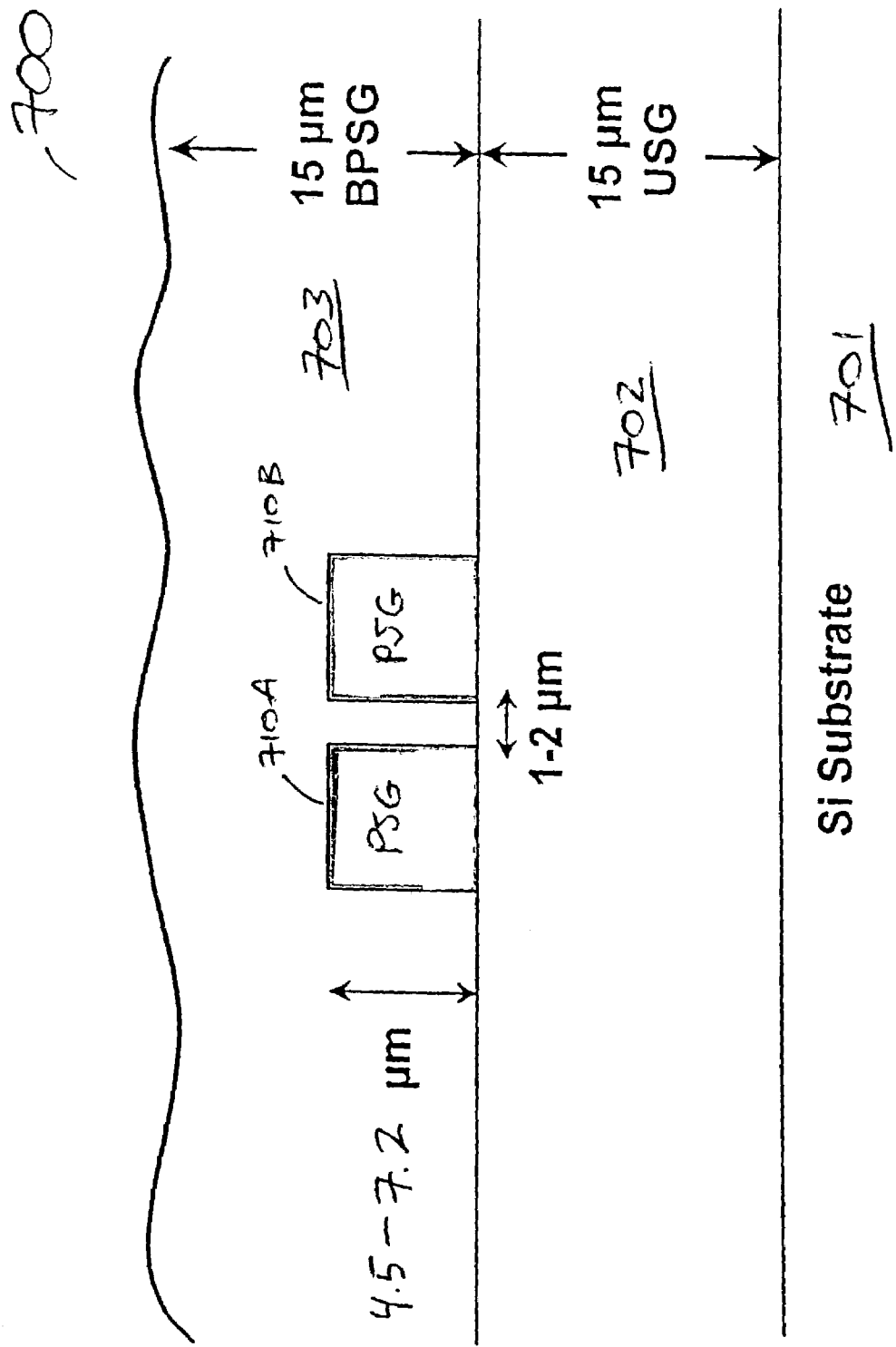
FIG. 7 illustrates an optical waveguide structure according to one embodiment of the present invention.

FIG. 7 illustrates an optical waveguide structure according to one embodiment of the present invention. The optical waveguide 700 may include PSG optical cores 710A and 710B deposited using embodiments of the PECVD process discussed herein. The optical waveguide 700 also includes a 15 μm USG layer 702 formed on a substrate 701. The USG layer 702 is the undercladding layer of the optical cores 710A and 710B. The uppercladding layer comprises a 15 μm BPSG layer 703. Typical PSG optical cores 710A and 710B may be 4.5 to 7.2 μm or more thick and separated by 1–2 μm for a refractive index of between about 1.467 to 1.473 measured at 633 nm, for example.

2. Exemplary PECVD Processing System

Figure 8A:
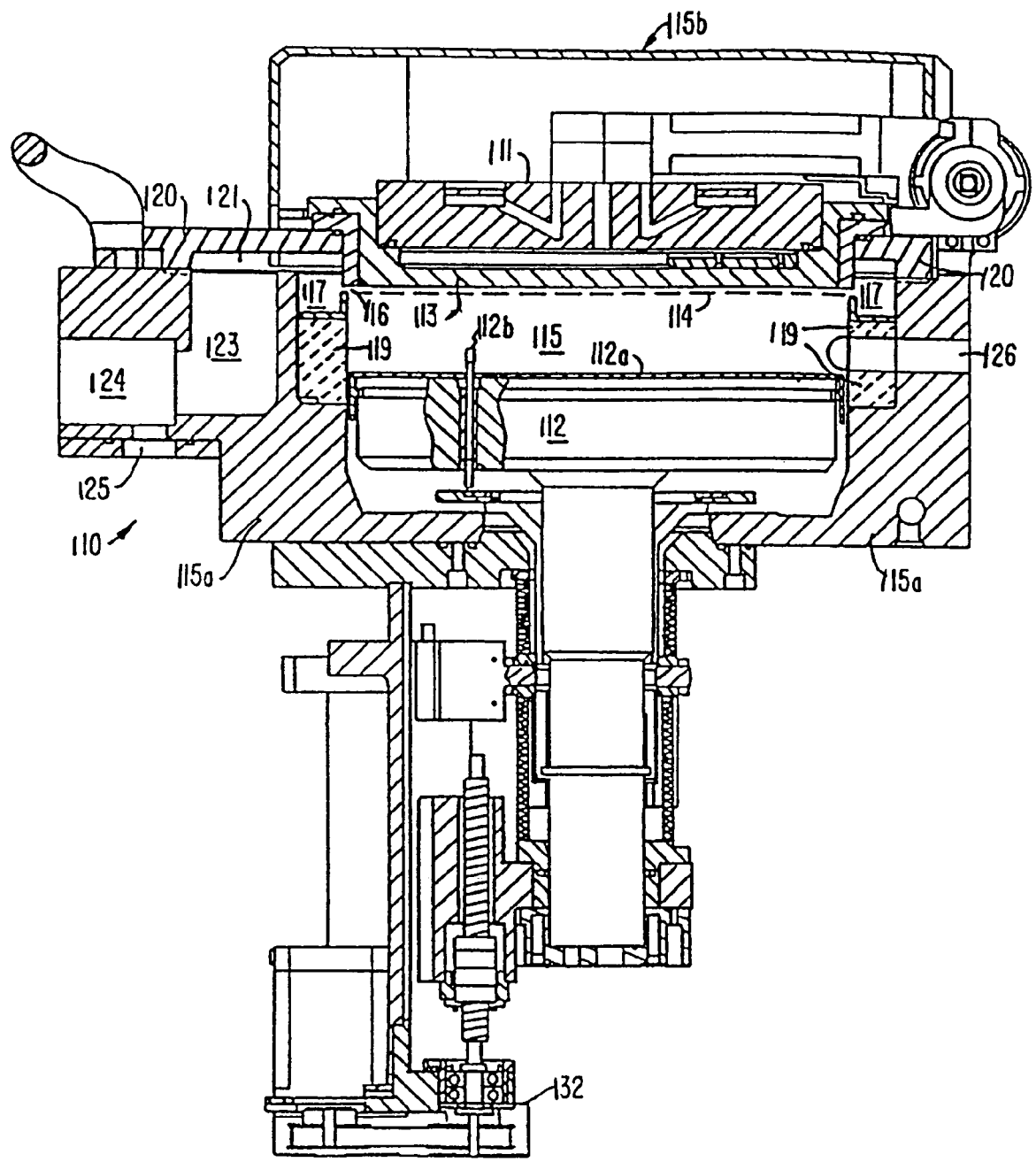
FIGS. 8A–B illustrate vertical and cross-sectional views of one suitable CVD system for practicing embodiments of the present invention.
Figure 8B:
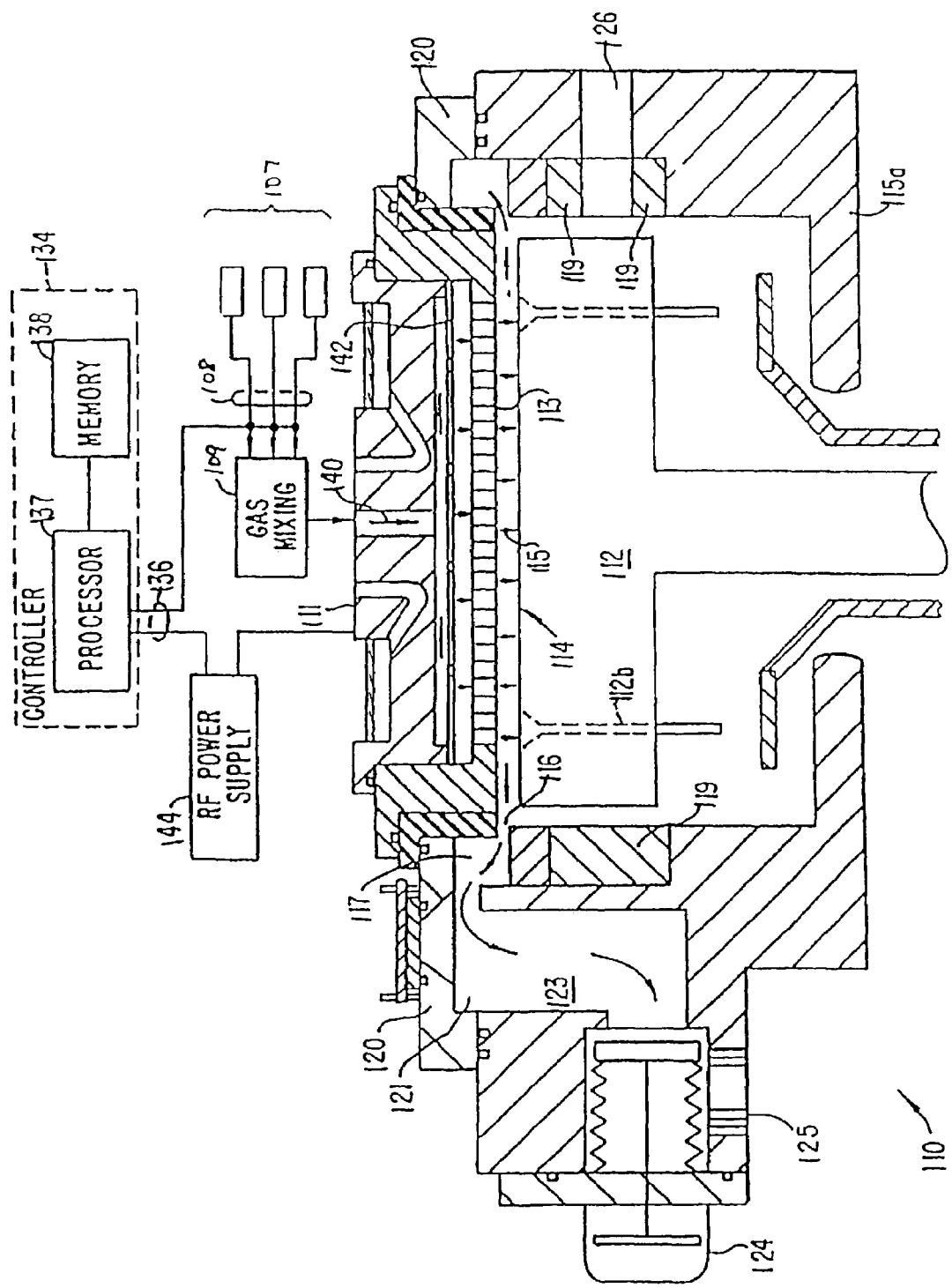

The PECVD process for forming a PSG optical core according to embodiments of the present invention can be carried out in a variety of different plasma CVD chambers. An example of one suitable chamber is set forth below and discussed with respect to FIGS. 8A and 8B, which are vertical, cross-sectional views of a CVD system 110, having a vacuum or processing chamber 115 that includes a chamber wall 115a and chamber lid assembly 115b.

CVD system 110 contains a gas distribution manifold 111 for dispersing process gases to a substrate (not shown) that rests on a heated pedestal 112 centered within the process chamber. During processing, the substrate (e.g. a semiconductor wafer) is positioned on a flat (or slightly convex) surface 112a of pedestal 112. The pedestal can be moved controllably between a lower loading/off-loading position (depicted in FIG. 8A) and an upper processing position (indicated by dashed line 114 in FIG. 8A and shown in FIG. 8B), which is closely adjacent to manifold 111. A centerboard (not shown) includes sensors for providing information on the position of the wafers.

Deposition and carrier gases are introduced into chamber 115 through perforated holes of a conventional flat, circular gas distribution or faceplate 113. More specifically, deposition process gases flow into the chamber through the inlet manifold 111 (indicated by arrow 140 in FIG. 8B), through a conventional perforated blocker plate 142 and then through holes in gas distribution faceplate 113.

Before reaching the manifold, deposition and carrier gases are input from gas sources 107 through gas supply lines 108 (FIG. 8B) into a mixing system 109 where they are combined and then sent to manifold 111. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 110 can be either a thermal process or a plasma-enhanced process. In a plasma-enhanced process, an RF power supply 144 applies electrical power between the gas distribution faceplate 113 and the pedestal so as to excite the process gas mixture to form a plasma within the cylindrical region between the faceplate 113 and the pedestal. (This region will be referred to herein as the "reaction region"). Constituents of the plasma react to deposit a desired film on the surface of the semiconductor wafer supported on pedestal 112. RF power supply 144 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 115. In a thermal process, RF power supply 144 would not be utilized, and the process gas mixture thermally reacts to deposit the desired films on the surface of the semiconductor wafer supported on pedestal 112, which is resistively heated to provide thermal energy for the reaction.

During a plasma-enhanced deposition process, the plasma heats the entire process chamber 110, including the walls of the chamber body 115a surrounding the exhaust passageway 123 and the shut-off valve 124. When the plasma is not turned on or during a thermal deposition process, a hot liquid is circulated through the walls 115a of the process chamber to maintain the chamber at an elevated temperature. A portion of these heat exchanging passages in the lid of chamber 110 are visible in FIG. 8B. The passages in the remainder of chamber walls 115a are not shown. Fluids used to heat the chamber walls 115a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber by a vacuum pump (not shown). Specifically, the gases are exhausted through an annular, slot-shaped orifice 116 surrounding the reaction region and into an annular exhaust plenum 117. The annular slot 116 and the plenum 117 are defined by the gap between the top of the chamber's cylindrical side wall 115a (including the upper dielectric lining 119 on the wall) and the bottom of the circular chamber lid 120. The 360° circular symmetry and uniformity of the slot orifice 116 and the plenum 117 help achieve a uniform flow of process gases over the wafer so as to deposit a uniform film on the wafer.

From the exhaust plenum 117, the gases flow underneath a lateral extension portion 121 of the exhaust plenum 117, past a viewing port (not shown), through a downward-extending gas passage 123, past a vacuum shut-off valve 124 (whose body is integrated with the lower chamber wall 115a), and into the exhaust outlet 125 that connects to the external vacuum pump (not shown) through a foreline (also not shown).

The wafer support platter of the pedestal 112 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 112.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

A lift mechanism and motor 132 (FIG. 8A) raises and lowers the heater pedestal assembly 112 and its wafer lift pins 112b as wafers are transferred into and out of the body of the chamber by a robot blade (not shown) through an insertion/removal opening 126 in the side of the chamber 110. The motor 132 raises and lowers pedestal 112 between a processing position 114 and a lower, wafer-loading position. The motor, valves or flow controllers connected to the supply lines 108, gas delivery system, throttle valve, RF power supply 144, and chamber and substrate heating systems are all controlled by a system controller 134 (FIG. 8B) over control lines 136, of which only some are shown. Controller 134 relies on feedback from optical sensors to determine the position of movable mechanical assemblies such as the throttle valve and susceptor which are moved by appropriate motors under the control of controller 134.

System controller 134 controls all of the activities of the CVD machine. The system controller has a processor 137 that executes system control software, which is a computer program stored in a computer-readable medium such as a memory 138. Preferably, memory 138 is a hard disk drive, but memory 138 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 134.

The above reactor description is mainly for illustrative purposes, and other types of plasma CVD equipment may be employed to form PSG optical cores. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

3. Further Exemplary Embodiments

Another suitable process recipe for depositing an PSG optical core on a 200 mm substrate using a PECVD process according to one embodiment of the present invention is summarized in Table 1 below:

TABLE 2

| Process Parameter | Value |
|---|---|
| Φ(SiH$_4$) (sccm) | 100 |
| Φ(N$_2$O) (sccm) | 3600 |
| 5% PH$_3$ in 95% N$_2$ (sccm) | 220 |
| Source RF Density-(Watts) | 400–470 |
| Pressure (millitorr) | 2.8 |
| Temp (° C.) | 400–550 |

The process in Table 2 may be carried out in a PECVD system similar to system 110 described above. For example, if system 110 is used, a ceramic heater and nitride faceplate may be used. The spacing between the pedestal surface and manifold may be set to 565 mils.

Figure 9:
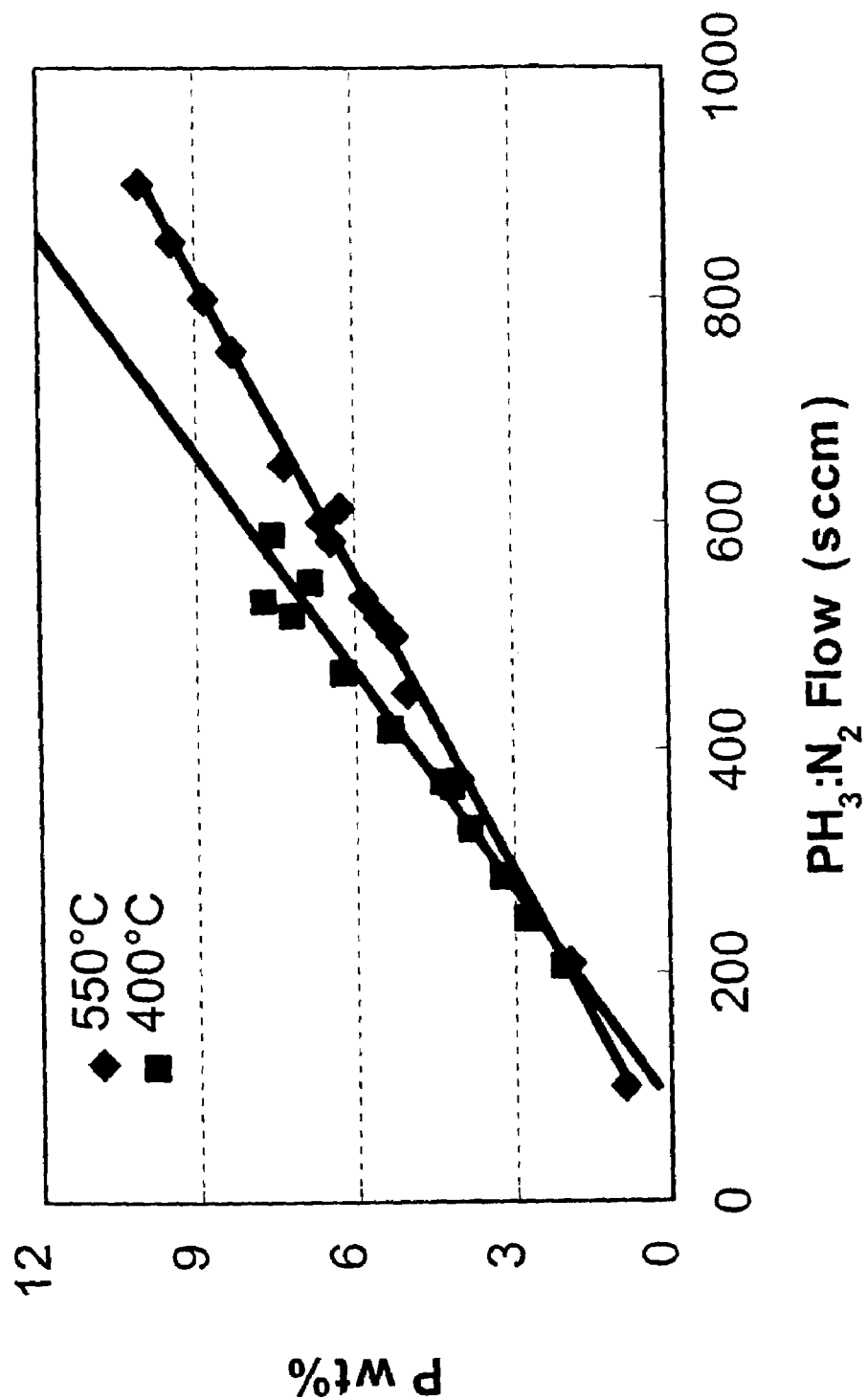
FIG. 9 shows experimental data illustrating the relationship between phosphorous concentration and $PH_3$ flow for temperatures of 400° C. and 550° C.

In order to better appreciate and understand the present invention, exemplary data derived from the process of Table 2 is set forth below. FIG. 9 shows experimental data illustrating the relationship between phosphorous concentration and PH$_3$ flow for temperatures of 400° C. and 550° C. The data illustrates that the phosphorous concentration changes with PH$_3$ flow according to an approximately linear relationship. Furthermore, it can be seen that more phosphorous is incorporated into the optical core at lower deposition temperatures.

Figure 10:
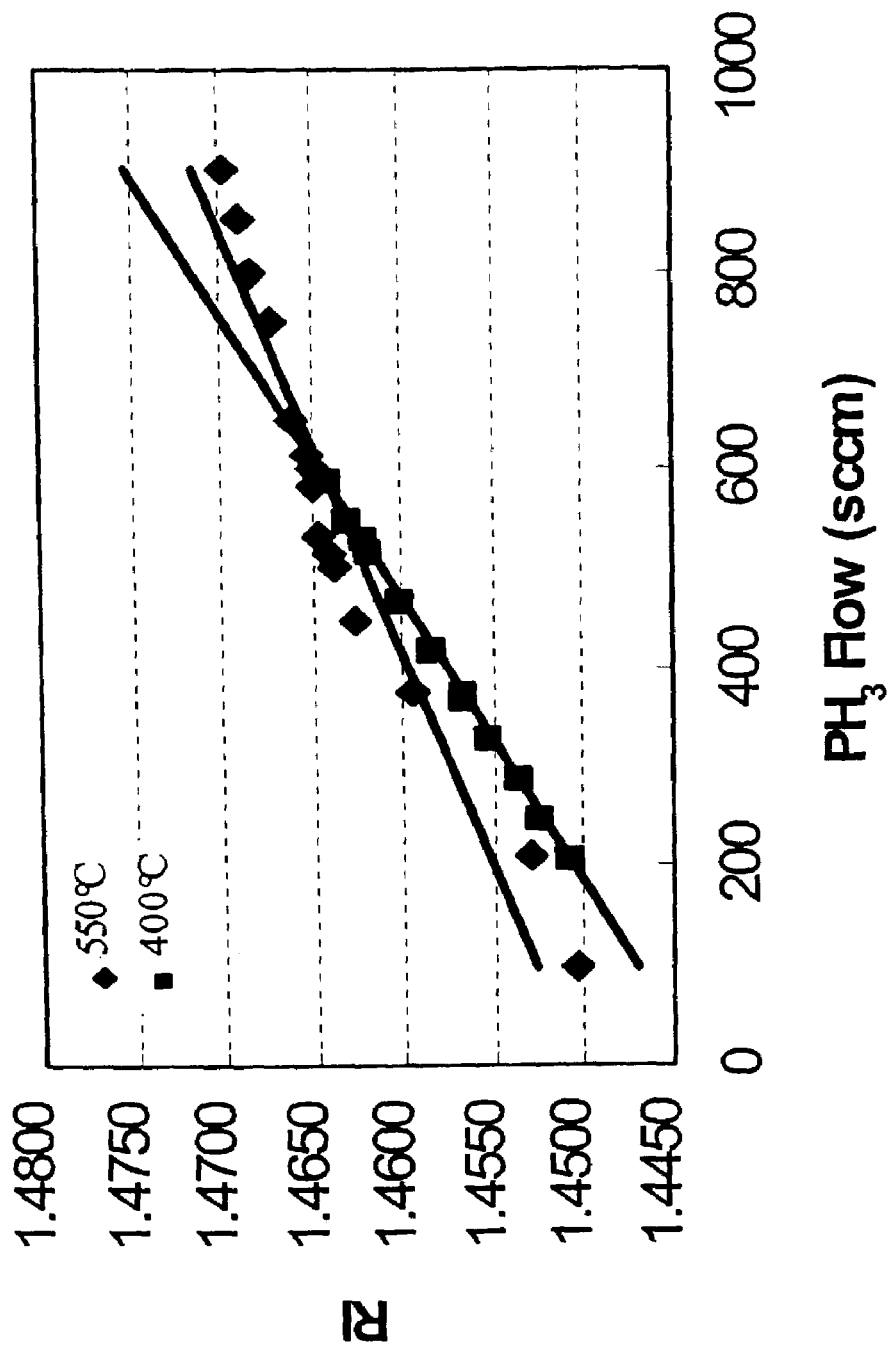
FIG. 10 shows experimental data illustrating the relationship between $PH_3$ flow and refractive index for temperatures of 400° C. and 550° C.

FIG. 10 shows experimental data illustrating the relationship between PH$_3$ flow and refractive index for temperatures of 400° C. and 550° C. For a flow greater than 600 sccm, the RF power was increased from 400 W to 470 W. The refractive index can be seen to increase with the PH$_3$ flow rate as the phosphorous concentration increases in the optical core (See FIG. 9).

Figure 11:
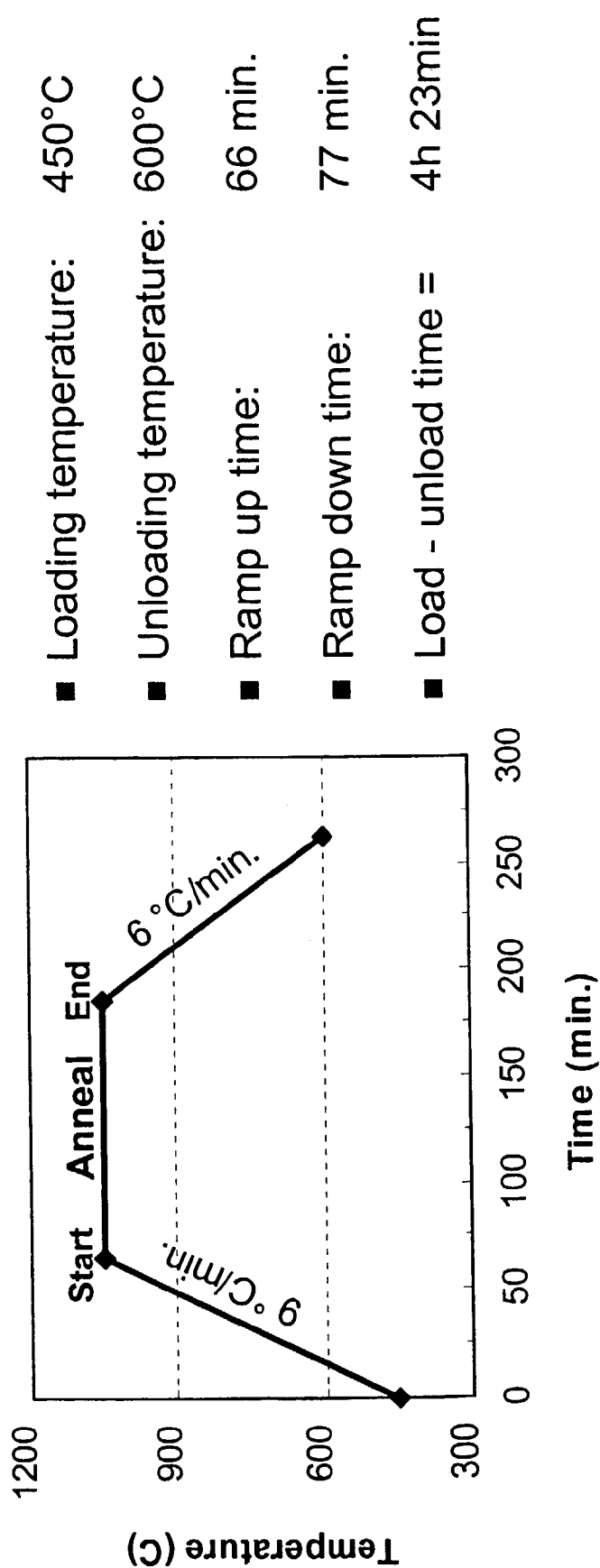
FIG. 11 illustrates an anneal step according to one embodiment of the invention.

As mentioned above, a post deposition anneal step may be added to further improve the optical qualities of the core. FIG. 11 illustrates an anneal step according to one embodiment of the invention. The material is soaked in a steam ambient at a temperature of about 1050° C. for about 1–2 hours. The loading temperature is about 450° C., with a ramp up time of about 66 minutes. After the soaking time, the temperature is ramped back down to an unloading temperature of about 600° C. over the course of about 77 minutes. Thus, the total load-unload time may be between about 3 hours and 23 minutes to 4 hours and 23 minutes.

Figure 12:
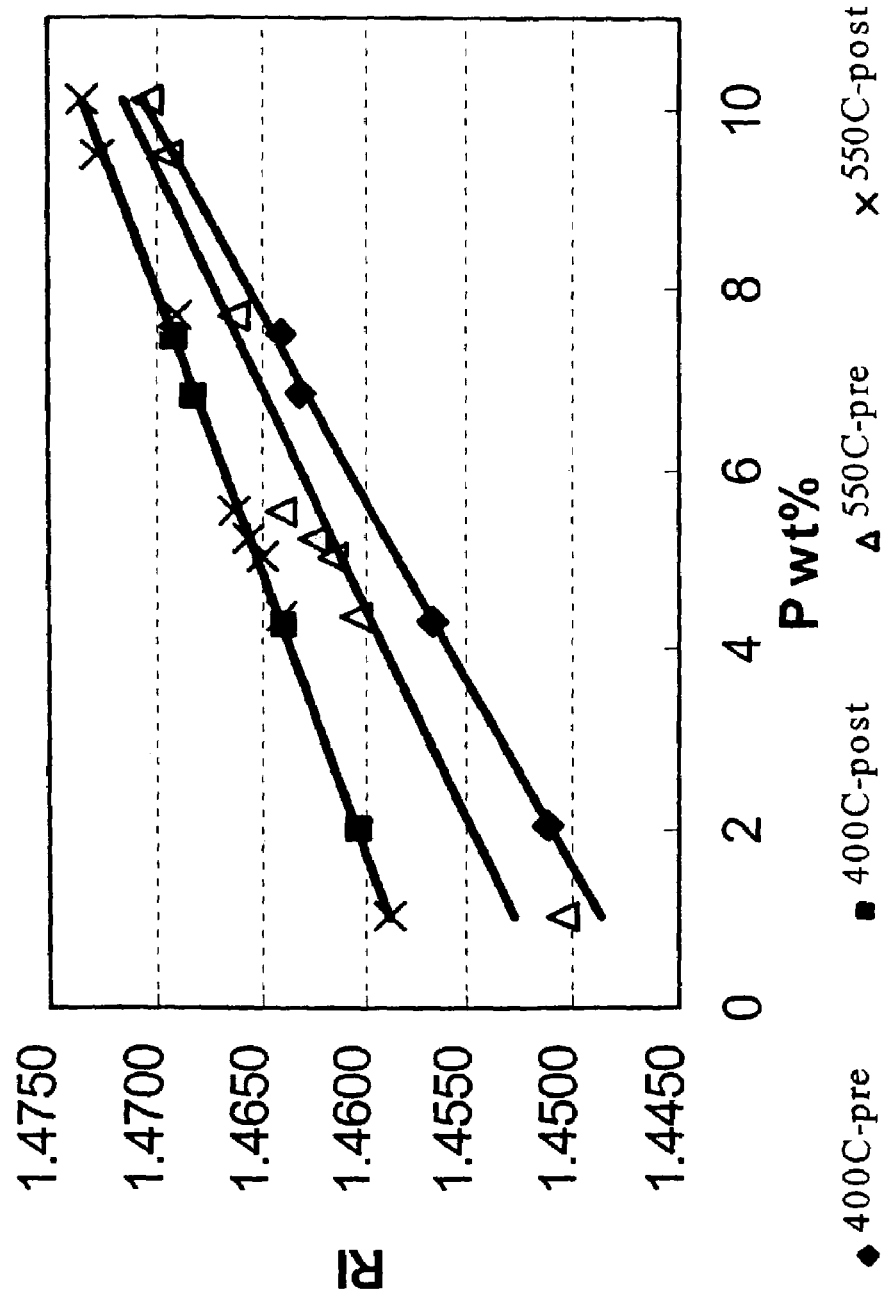
FIG. 12 illustrates the relationship of phosphorous content and steam anneal on the refractive index of a 7 μm thick PSG film at 400° C. and 550° C. according to one embodiment of the present invention.

FIG. 12 illustrates the relationship of phosphorous content and steam anneal on the refractive index of a 7 μm thick PSG films at 400° C. and 550° C. according to one embodiment of the present invention. The refractive index of the PSG optical core can be seen to increase with phosphorous content and deposition temperature. Post anneal refractive index also increases with phosphorous content according to an approximately linear relation. However, the refractive index is substantially independent of deposition temperature.

Figure 13:
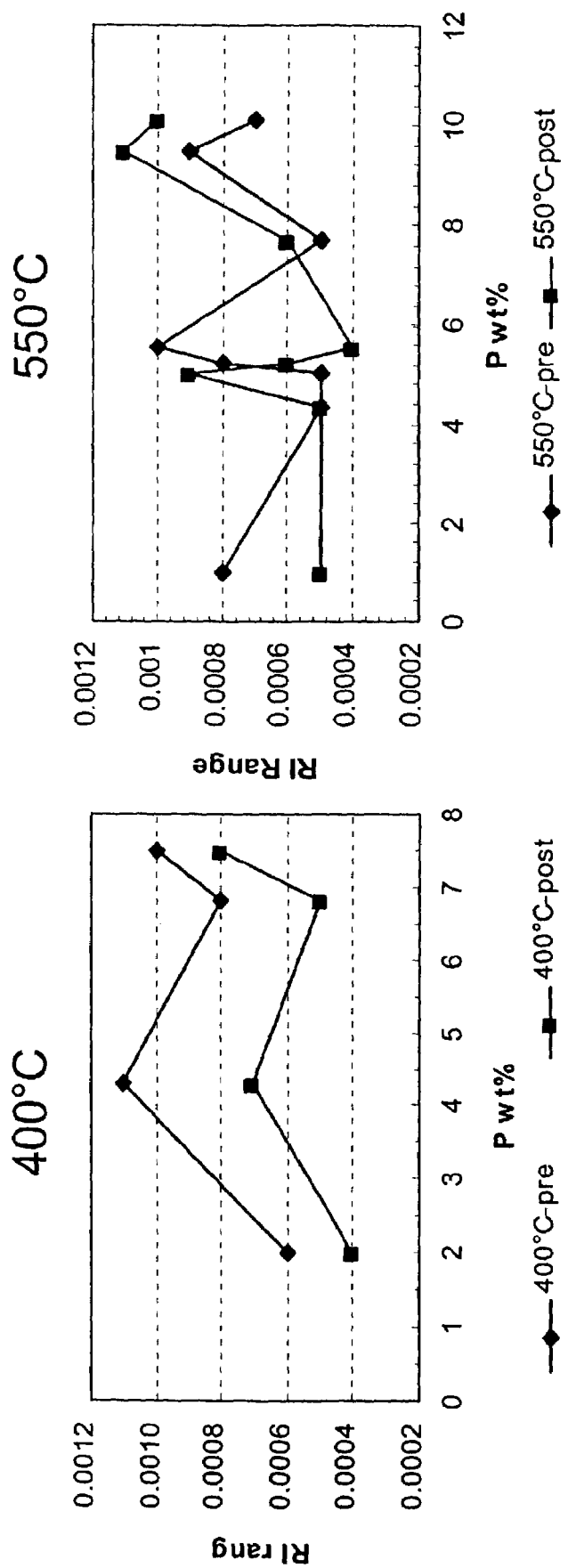
FIG. 13 illustrates the relationship of phosphorous content and steam anneal on the refractive index range of a 7 μm thick PSG film deposited at 400° C. and 550° C. according to one embodiment of the present invention.

FIG. 13 illustrates the relationship of phosphorous content and steam anneal on the refractive index range (i.e., uniformity) of a 7 μm thick PSG film deposited at 400° C. and 550° C. according to one embodiment of the present invention. At 400° C., the refractive index varied between 0.0006 to 0.0011 before anneal and 0.0004 to 0.0008 post anneal, which corresponds to a post anneal uniformity of about±0.0002. At 550° C., the refractive index varied between 0.0005 to 0.001 before anneal and 0.0004 to 0.0011 post anneal, which corresponds to a post anneal uniformity of about ±0.0004. Thus, the process of Table 2 has been used to obtain a uniformity of at least ±0.0004, which is suitable for optical applications.

Figure 14:
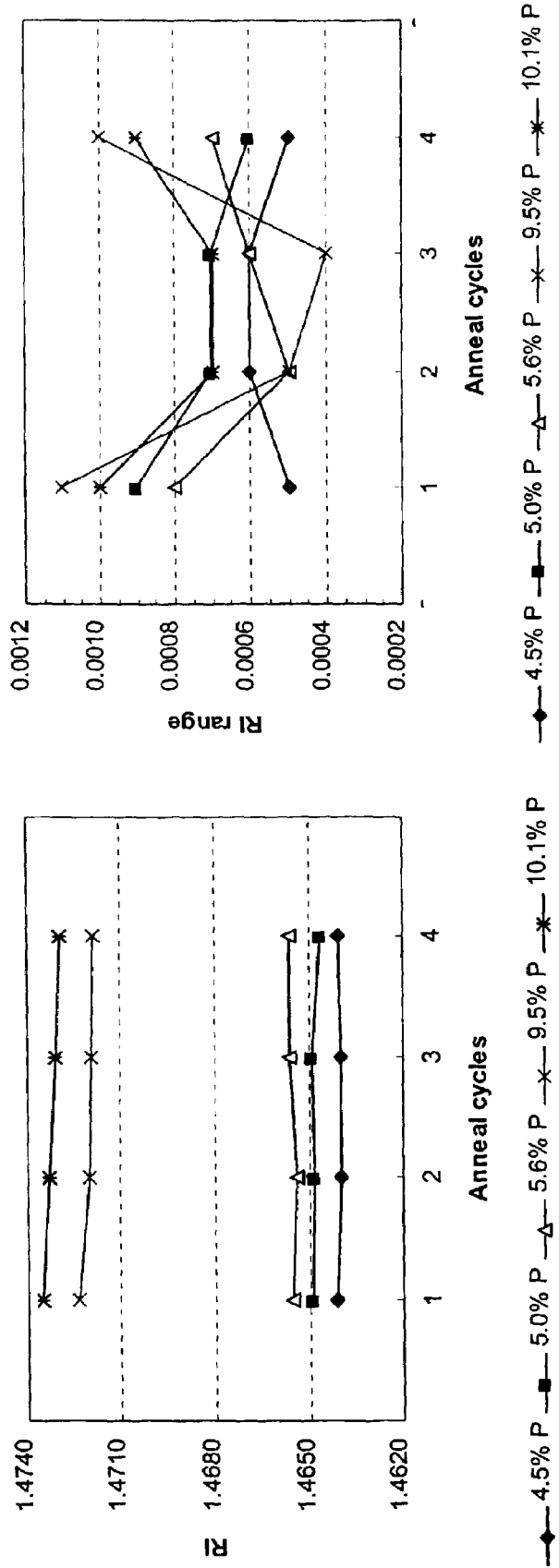
FIG. 14 illustrates the effect of multiple steam anneal cycles on the refractive index range of a 7 μm thick PSG film embodiments of the present invention.

FIG. 14 illustrates the effect of multiple steam anneal cycles on the refractive index range of a 7 µm thick PSG film embodiments of the present invention. While multiple anneal cycles do not substantially change the refractive index, the uniformity can be seen to improve after two cycles.

Figure 15:
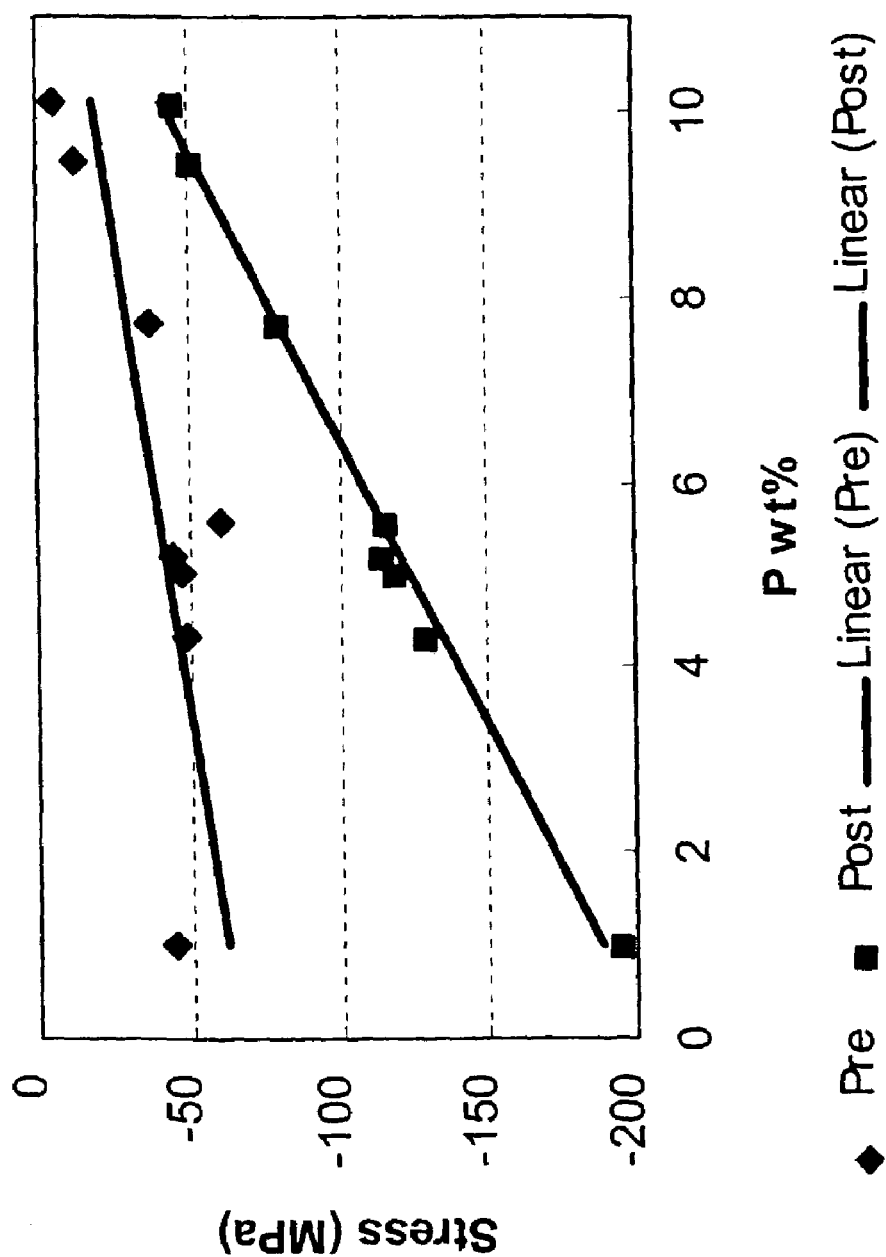
FIG. 15 illustrates the effect of phosphorous content and steam anneal on stress.
Figure 16:
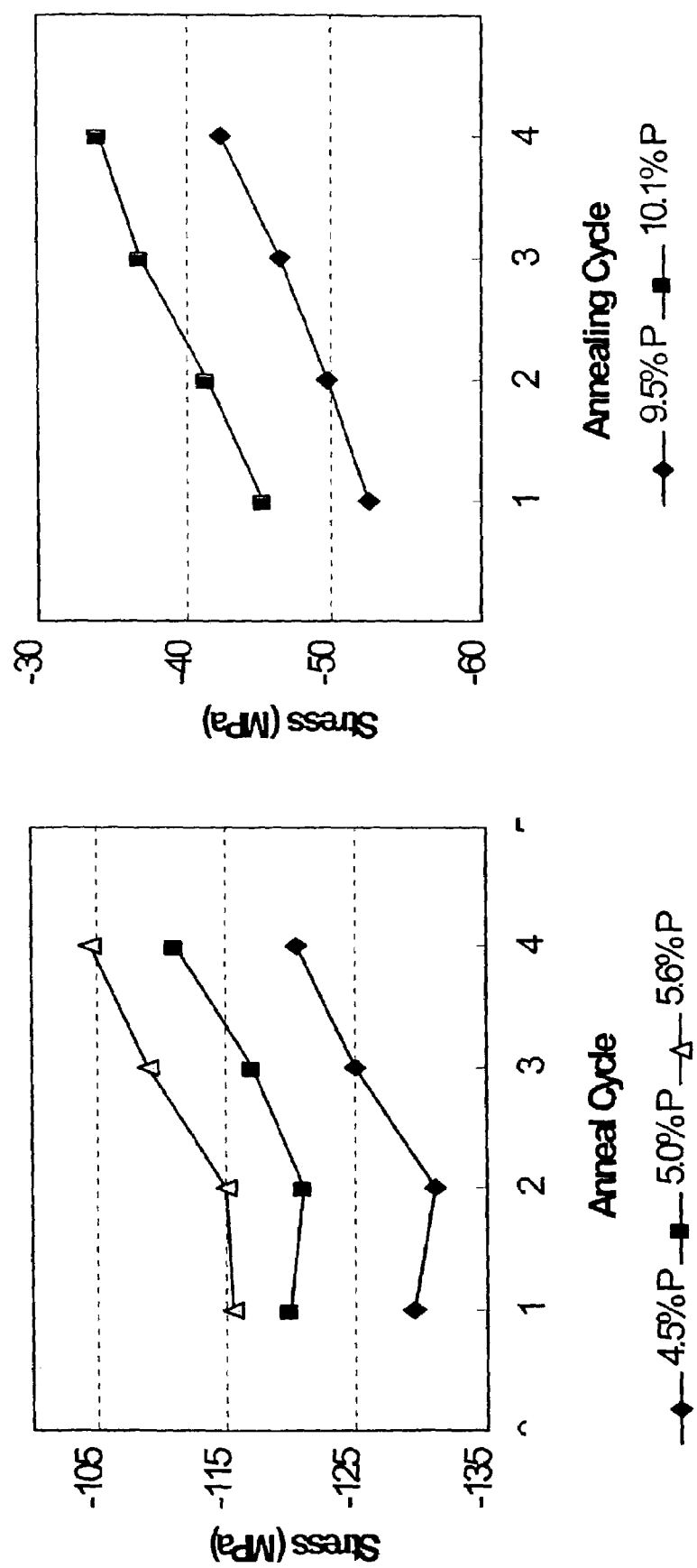
FIG. 16 illustrates the effect of multiple anneal cycles on stress. As the phosphorous content is increased the PSG film becomes less compressive.

FIG. 15 illustrates the effect of phosphorous content and steam anneal on stress. FIG. 16 illustrates the effect of multiple anneal cycles on stress. As the phosphorous content is increased the PSG film becomes less compressive. While the PSG film becomes more compressive after one anneal cycle for lower phosphorous concentrations, FIG. 16 illustrates that stress is generally reduced for multiple anneal cycles. In fact, PSG optical cores having phosphorous concentrations levels above about 6.5 wt. % achieved stresses of less than −100 MPa. As evident from FIGS. 15 and 16, the stress of the PSG film will increase after anneal as shown in FIG. 15, but more annealing cycles will cause the stress to decrease as shown in FIG. 16.

Figure 17:
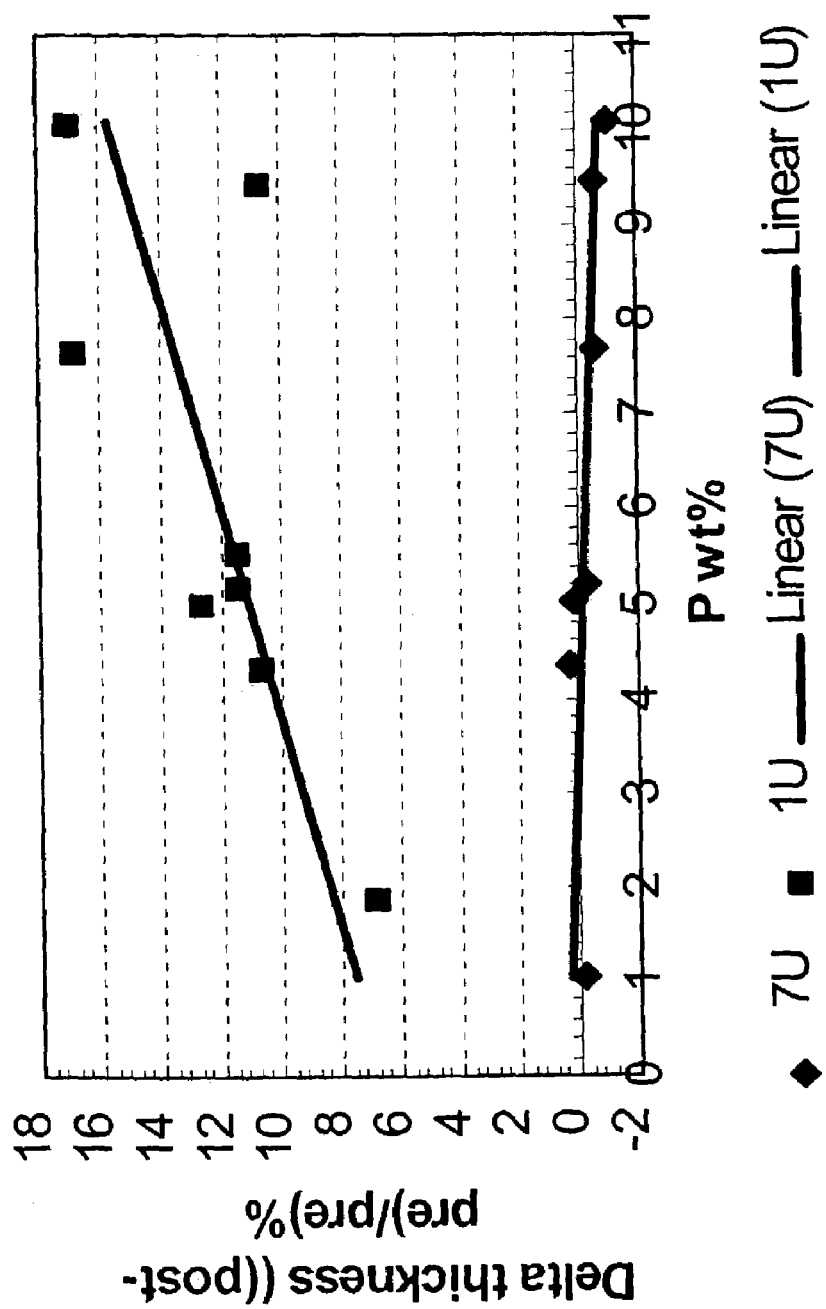
FIG. 17 illustrates the effect of phosphorous content and steam anneal on the change in thickness of PSG films.

FIG. 17 illustrates the effect of phosphorous content and steam anneal on the change in thickness of PSG films. Steam anneal will not result in a substantive change in the thickness of a 7 µm PSG optical core. However, steam anneal will cause a substantive change in the thickness of a 1 µm PSG layer. As the phosphorous content is increased, the change in thickness on a 1 µm PSG layer is exacerbated. For phosphorous content between 1 wt. % to 10 wt. %, the PSG layer experienced a change in thickness of about 8–17%. It is believed that the change in thickness is due to the growth of thermal oxide between the PSG layer and underlying silicon materials. Higher phosphorous concentrations in the PSG layer can lead to greater changes in thickness because $H_2O$ can diffuse faster in more heavily doped PSG material than in less heavily doped material. Accordingly, thinner PSG structures will be more susceptible to changes in thickness, and must have such changes taken into account during the routine design process of the particular PSG optical core as would be known to those skilled in the art.

FIG. 18 illustrates a PECVD process recipe 1800 for depositing a PSG optical core according to another embodiment of the present invention. Some of the primary control variable listed along the column 1801 include step time, pressure, RF power, heater temperature, heater spacing, and flow rates. Process recipe includes a post deposition termination step wherein all deposition source gases are turned off except the oxygen containing gas (e.g., the silicon containing gas and phosphorous containing gas are turned off) so that optical imperfections in the PSG optical core are reduced.

FIG. 18 illustrates a method of forming a PSG optical core using a PECVD process according to one embodiment of the present invention. At step 1810, the PECVD deposition chamber is preheated to 550° C. At step 1820, an oxygen containing gas such as $N_2O$ is introduced into the chamber at a flow rate of 3600 sccm. At step 1830, a silicon containing gas, such as $SiH_4$, and a phosphorous containing gas, such as 5% $PH_3$ diluted in $N_2$, are introduced into the deposition chamber at flow rates of 100 sccm and 220 sccm, respectively. At step 1840, an RF power of 400 Watts is applied to create a plasma in the deposition chamber, and a PSG optical core is deposited on a substrate located in the chamber. After an amount of time corresponding to the desired thickness of the optical core (e.g., 135 seconds), the silicon containing gas and phosphorous containing gas are evacuated from the chamber at step 1850 (i.e., the silicon and phosphorous sources are turned off). However, the oxygen containing gas, $N_2O$, is maintained in the chamber to reduce optical imperfections (i.e., hazing) in the PSG optical core. At step 1860, the RF power is turned off, and the oxygen containing gas is evacuated from the chamber.

Having fully described several embodiments of the present invention, many other equivalent or alternative methods of forming a PSG optical waveguide core using a PECVD process according to the present invention will be apparent to those skilled in the art. These alternatives and equivalents are intended to be included within the scope of the present invention.

What is claimed is:

1. A method of forming an optical waveguide on an undercladding layer of a substrate, the method comprising:
   forming at least one silicate glass optical core on said undercladding layer using a plasma enhanced chemical vapor deposition process including a silicon source gas, an oxygen source gas, and a phosphorus source gas, wherein the oxygen source gas and silicon source gas have a ratio of oxygen atoms to silicon atoms greater than 20:1; and
   thereafter evacuating all source gases, except the oxygen source gas, from the deposition chamber after the optical core is formed to expose the at least one silicate glass optical core to a plasma formed from gas consisting essentially of the oxygen source gas.

2. The method of claim 1 wherein the oxygen source comprises $N_2O$.

3. The method of claim 1 wherein exposing the at least one silicate glass optical core to the plasma formed from gas consisting essentially of the oxygen source gas is performed for between about 5 to 10 seconds.

4. The method of claim 1 wherein the oxygen source gas includes $N_2O$, $CO_2$, or CO and the phosphorous source gas includes $PH_3$.

5. The method of claim 1 wherein the contrast between the refractive index of the optical core and the refractive index of the undercladding layer is less than 2%.

6. The method of claim 5 wherein the contrast between the refractive index of the optical core and the refractive index of the undercladding layer is in the range between about 0.6% to 1.0%.

7. The method of claim 1 wherein the plasma enhanced chemical vapor deposition process comprises pressure of less than 10 Torr and an RF energy in the range of about 1–2 Watts/$cm^2$.

8. The method of claim 1 wherein the phosphorous content of the optical core is in the range of about 6.5 wt. % to 11.0 wt. %.

9. The method of claim 1 wherein the thickness of the optical core is greater than about 4.5 µm.

10. The method of claim 9 wherein the thickness of the optical core is in the range of 4.5 µm to 7.2 µm.

11. The method of claim 1 wherein the refractive index of the optical core is less than 1.5.

12. The method of claim 11 wherein the refractive index of the optical core is in the range of about 1.46 to 1.475.

13. The method of claim 1 wherein the phosphorous source gas includes $PH_3$.

14. The method of claim 13 wherein the phosphorous source gas is $PH_3$ diluted in $N_2$.

15. The method of claim 13 wherein the phosphorous source gas is PH3 diluted in an inert gas.

16. The method of claim 13 wherein the phosphorous source gas is 100% $PH_3$.

17. The method of claim 1 wherein the oxygen source gas is $N_2O$, $CO_2$, or CO.

18. The method of claim 1 wherein the deposition temperature is greater than 300° C.

19. The method of claim 1 wherein the deposition temperature is between about 400° C. to 550° C.

20. The method of claim 1 further comprising an anneal step.

21. The method of claim 20 wherein the anneal step includes an ambient of steam, molecular oxygen, or molecular nitrogen, at a temperature between about 1000° to 1100° C. for between about 2 to 4 hours.

22. The method of claim 20 wherein the anneal step includes an ambient of steam at a temperature between about 1000° C. to 1100° C. for between about 2 hours.

* * * * *